United States Patent
Joshi et al.

(10) Patent No.: US 10,013,508 B2
(45) Date of Patent: Jul. 3, 2018

(54) JOINT PROBABILISTIC MODELING AND INFERENCE OF INTERSECTION STRUCTURE

(71) Applicant: Toyota Motor Engineering & Manufacturing North America, Inc., Erlanger, KY (US)

(72) Inventors: Avdhut S. Joshi, Ann Arbor, MI (US); Michael R. James, Northville, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 882 days.

(21) Appl. No.: 14/508,653

(22) Filed: Oct. 7, 2014

(65) Prior Publication Data

US 2016/0098496 A1  Apr. 7, 2016

(51) Int. Cl.
 *G06F 17/50* (2006.01)
(52) U.S. Cl.
 CPC ................. *G06F 17/5004* (2013.01)
(58) Field of Classification Search
 None
 See application file for complete search history.

(56) References Cited

U.S. PATENT DOCUMENTS

| 6,278,942 | B1 | 8/2001 | McDonough |
| 7,376,508 | B2 | 5/2008 | Barkowski et al. |
| 8,031,062 | B2 | 10/2011 | Smith |
| 8,712,624 | B1 | 4/2014 | Ferguson et al. |
| 2010/0241354 | A1 | 9/2010 | Stahlin et al. |
| 2011/0071801 | A1* | 3/2011 | Carrasco ............. G06F 17/5004 703/1 |
| 2012/0245817 | A1 | 9/2012 | Cooprider et al. |

(Continued)

FOREIGN PATENT DOCUMENTS

| DE | 102009024153 A1 | 9/2010 |
| JP | 2006162409 A | 6/2006 |

(Continued)

OTHER PUBLICATIONS

Stephanie Lafevre, Exploiting map information for driver intention estimation at road intersection, Jun. 5, 2011, pp. 1-6.*

(Continued)

*Primary Examiner* — Syed Roni
(74) *Attorney, Agent, or Firm* — Christopher G. Darrow; Darrow Mustafa PC

(57) ABSTRACT

A method of modeling an intersection structure of a roadway. The method includes receiving a first data set including road lane information, and receiving a second data set including vehicle trajectory information for an intersection structure of a roadway. The method includes determining lane node locations from at least one of the first and second data sets. A set of potential links between the lane node locations may be compiled. The method may further include assessing, for each link, a probability that the link is a valid link, and assigning each link with a probability value. The links may be filtered based on a predetermined threshold probability value and a set of valid links is generated. A model of the intersection structure is created based on the set of valid links.

14 Claims, 9 Drawing Sheets

(56) References Cited

U.S. PATENT DOCUMENTS

| | | | |
|---|---|---|---|
| 2012/0310504 A1 | 12/2012 | DuHadway et al. | |
| 2012/0310516 A1 | 12/2012 | Zeng | |
| 2013/0018572 A1 | 1/2013 | Jang | |
| 2013/0173150 A1 | 7/2013 | Ghislo | |
| 2013/0179382 A1* | 7/2013 | Fritsch | G06N 7/005 706/46 |

FOREIGN PATENT DOCUMENTS

| | | | |
|---|---|---|---|
| JP | 2007332794 A | 12/2007 |
| JP | 4738360 A | 8/2008 |
| JP | 4861851 A | 8/2008 |
| KR | 10-0762507 B1 | 10/2007 |

OTHER PUBLICATIONS

Choi et al., Locating Intersections for Autonomous Vehicles: A Bayesian Network Approach, Apr. 2007, in 3 pages.

Boyko, et al., "Extracting roads from dense point clouds in large scale urban environment", ISPRS Journal of Photogrammetry and Remote Sensing, Nov. 8, 2011 in 16 pages.

Curran, et al., "OpenStreetMap", International Journal of Interactive Communication Systems and Technologies, 2 (1), 69-78, Jan.-Jun. 2012. pp. 69-78.

Niedevshi et al., "Accurate Ego-Vehicle Global Localization at Intersections Through Alignment of Visual Data with Digital Map", Jun. 2013.

Thrun et al., "The GraphSLAM Algorithm with Application to Large-Scale Mapping of Urban Structures", The International Journal of Robotics Research, vol. 25, No. 5-6, May-Jun. 2006, pp. 403-429.

\* cited by examiner

JOINT PROBABILISTIC MODELING AND INFERENCE OF INTERSECTION STRUCTURE

TECHNICAL FIELD

The present disclosure generally relates to methods for generating accurate roadway maps and, more particularly, to methods for generating a model of an intersection structure of a roadway.

BACKGROUND

The background description provided herein is for the purpose of generally presenting the context of the disclosure. Work of the presently named inventors, to the extent it may be described in this background section, as well as aspects of the description that may not otherwise qualify as prior art at the time of filing, are neither expressly nor impliedly admitted as prior art against the present technology.

Maps, in either printed or digitally displayed form, often show a road as a single line or as two narrowly spaced apart lines. The width of the space or line may or may not be proportional to the actual width of the road. Typically, such maps do not show the number of lanes in the road or additional exit lanes, bicycle lanes, etc. Nor do they illustrate any details of roadway intersections or valid paths that a vehicle is allowed to take when passing through the intersections.

Fully automated driving systems are preferably designed to operate a vehicle on a road without driver interaction or other external control, for example, in self-driving or autonomous vehicles. Advanced driver safety systems monitor the situation of a vehicle, including its location and the location of vehicles in its vicinity. Such systems may require maps that encode both lane-level and roadway intersection information with high degrees of precision. The lane-level and roadway intersection information may be used in a variety of situations, such as for generating a smooth trajectory for path planning, for predicting the behavior of other vehicles, or for planning and/or reasoning proper vehicle behavior at intersections.

In many cases, maps are generated either through a tedious manual annotation process, by driving the exact lane layout with a test vehicle, or by analyzing a collection of GPS tracks. The methods require significant amounts of manual work, either through annotation or for collection.

Accordingly, it would be desirable to provide accurate, detailed intersection maps with less preparation effort.

SUMMARY

This section provides a general summary of the disclosure, and is not a comprehensive disclosure of its full scope or all of its features.

In various aspects, the present teachings provide a method of modeling an intersection structure of a roadway. The method may include receiving a first data set including road lane information, and receiving a second data set including vehicle trajectory information for an intersection structure of a roadway. The method may include determining lane node locations from at least one of the first and second data sets. A set of potential links between the lane node locations may be compiled. The method may further include assessing, for each link, a probability that the link is a valid link and assigning each link with a probability value. The links may be filtered based on a predetermined threshold probability value and the method may include generating a set of valid links. A model of the intersection structure may be created based on the set of valid links. The road lane information may be received from a first source, such as a map database or lane estimation algorithm, and the vehicle trajectory information may be obtained from a second source, such as LIDAR, radar, still image data, video data, etc.

In other aspects, the present teachings provide a method of modeling an intersection structure of a roadway including identifying a set of links between lane node locations for an intersection structure of a roadway. Vehicle trajectory information from the intersection structure may be used to generate a set of vehicle tracks that passed through the intersection. The method includes categorizing the vehicle tracks into complete tracks and partial tracks. For each partial track, an assessment may be made regarding a probability that the partial track correlates to a link. The probability may be determined using a Bayesian Model Averaging technique. The method includes generating a set of valid links and creating a model of the intersection structure based on the set of valid links.

In various aspects, the Bayesian Model Averaging technique may be governed by the equation:

$$p(\lambda_q|T) = \Sigma_{m \in M} p(\lambda_q|m) p(m|T)$$

wherein $p(\lambda_q|T)$ is the probability value of the link ($\lambda_q$), given a set of partial tracks (T), where m is an intersection model and a set of intersection models (M) is parsimonious with the data.

Further areas of applicability and various methods of enhancing mapping technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

Figure 1:
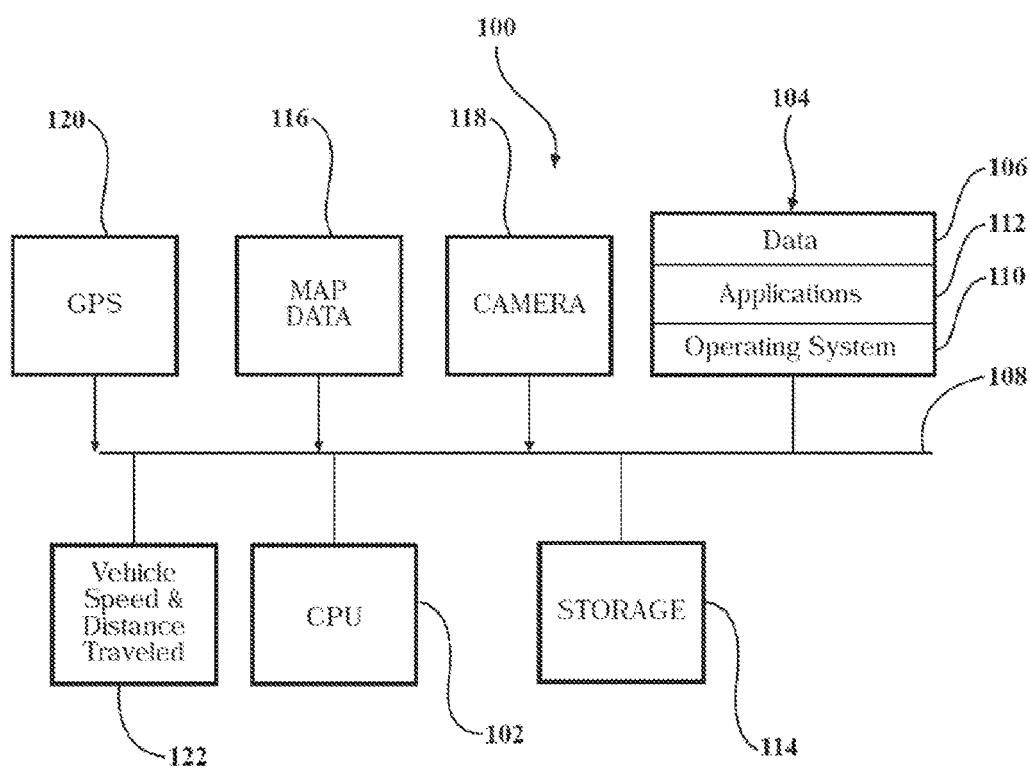
FIG. 1 is a block diagram of a computing device that may be used with methods of the present disclosure.

It should be noted that the figures set forth herein are intended to exemplify the general characteristics of materials, methods, and devices among those of the present technology, for the purpose of the description of certain aspects. These figures may not precisely reflect the characteristics of any given aspect, and are not necessarily intended to define or limit specific embodiments within the scope of this technology. Further, certain aspects may incorporate features from a combination of figures.

DETAILED DESCRIPTION

The following description is merely illustrative in nature and is in no way intended to limit the disclosure, its application, or uses. As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure, and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims.

The present technology generally relates to joint probabilistic modeling and the inference of intersection structures of a roadway that may be driven on by a vehicle, such as an automobile. As used herein, it should be understood that the term vehicle should not be construed narrowly, and should include all types of vehicles, with non-limiting examples including a passenger car, truck, motorcycle, off-road vehicle, bus, boat, airplane, helicopter, lawn mower, recreational vehicle, amusement park vehicle, farm vehicle, construction vehicle, tram, golf cart, train, or trolley.

Many tasks relevant to driver support and semi-automated or autonomous vehicles (such as vehicle detection and tracking, path planning, and control) benefit from the use of high-precision street maps. Roadway intersections present unique challenges due to the lack of paint markings, the increased number of valid (legal or semi-legal) vehicle behaviors, and increased variability in the trajectories actually driven. By way of example, two vehicles driving and making the same left-hand turn may traverse significantly different paths across the intersection, yet they ultimately enter and exit the same lanes of the intersection. Thus, the present technology contemplates a probabilistic model and inference procedure for estimating a set of valid connections between lanes entering and exiting of an intersection.

Non-limiting examples of the input for various algorithms used herein may include lane mapping and/or lane node information, as well as a set of vehicle tracks derived from LIDAR data obtained from a test vehicle. As will be explained below, the tracks may be both positionally noisy and may not actually fully traverse the intersection due to loss of tracking, or for a variety of other reasons. Still further, there may be significant ambiguity in the data association between the tracked vehicles and possible intersection structures. Notwithstanding, the present technology is able to provide a probabilistic model that can reason jointly over all the components of an intersection structure. The model is arrived at using a Bayesian Model Averaging technique that is able to uncover the intersection structure in a wide variety of real-world situations and with noisy input data.

In order to use the techniques of the present disclosure, it is desirable to identify lane nodes and vehicle trajectory information for a given intersection. FIG. 1 is a block diagram of an exemplary computing device 100 that may be used for implementing certain methods, or portions thereof, relating to the identification of lane nodes or map data that will ultimately lead one to determine appropriate road segments and lane nodes. The computing device 100 may be any type of vehicle-installed, handheld, desktop, or other form of single computing device, or can be composed of multiple computing devices. The processing unit in the computing device can be a conventional central processing unit (CPU) 102 or any other type of device, or multiple devices, capable of manipulating or processing information. The memory 104 in the computing device 100 can be a random access memory device (RAM) or any other suitable type of storage device. The memory 104 can include data 106 that is accessed by the CPU 102 using a bus 108.

The memory 104 can also include an operating system 110 and installed applications 112. The installed applications 112 can include programs that permit the CPU 102 to perform the methods described below. The computing device 100 can also include secondary, additional, or external storage 114, for example, a memory card, flash drive, or any other form of computer readable medium. The installed applications 112 can be stored in whole or in part in the external storage 114 and loaded into the memory 104 as needed for processing.

The computing device 100 can also be coupled to one or more sensors 116, 118, 120, and 122. The sensors 116, 118, 120, and 122 can capture data and/or signals for processing by an inertial measurement unit (IMU), a dead-reckoning system, a global navigation satellite system (GPS), a light detection and ranging (LIDAR) system, a radar system, a sonar system, an image-based sensor system, or any other type of system capable of capturing information specific to the environment surrounding a vehicle, including features of the route being travelled by the vehicle, or other localized position data and/or signals and outputting corresponding data and/or signals to the CPU 102. Generally, a pose and motion estimate can come from an Applanix POS-LV 220 inertial GPS Navigational System. This system generates pose estimates at 100 Hz. LIDAR data may be from a Velodyne HDL-64 E system, which uses 64 laser beams and spins at 10 Hz. In addition to a 3D position for each Lidar return, the HDL 64E may also measure an 8 bit intensity, corresponding to the relative reflectivity of the surface being illuminated.

The sensors 118 and 120 can also capture data representative of changes in x, y, and z-axis position, velocity, acceleration, rotation angle, and rotational angular rate for the vehicle. If the sensors 118 and 120 capture data for a dead-reckoning system, data relating to wheel revolution speeds, travel distance, steering angle, and steering angular rate of change can be captured. If the sensors 118 and 120 capture signals for a GPS, a receiver can calculate vehicle position and velocity estimated in global coordinates. A plurality of satellites can be used to estimate the vehicle's position and velocity using three-dimensional triangulation and time estimation.

Figure 2:
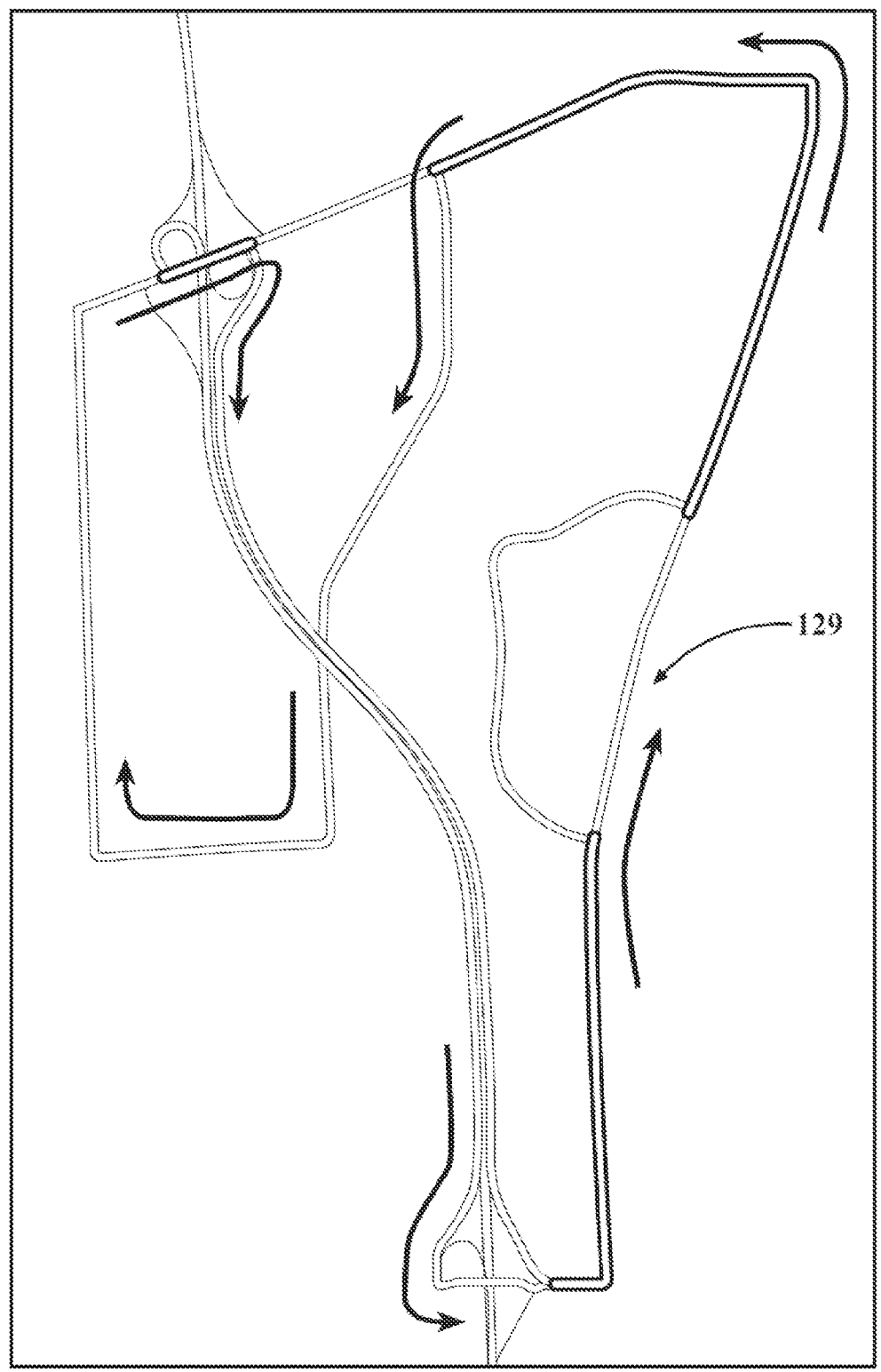
FIG. 2 is a pictorial representation of an exemplary road course that may be followed in collecting various LIDAR information.

The computing device 100 can be located within a test or experimental data gathering vehicle or can be located remotely from a vehicle in an alternate location (not shown). If the computing device 100 is located remotely from the vehicle, the vehicle can include the capability of communicating with the computing device 100. In various aspects, a vehicle may be driven in one direction along a given route 129 as shown in FIG. 2. The route 129 may include a variety of different roads. For example, FIG. 2 is shown including a multi-lane freeway with entrance and exit ramps, two lane rural roads, and a multi-lane bi-directional street.

In order to gather the lane data, the vehicle should be driven in one lane along the route 129 at least once. Multiple passes may be employed to improve the accuracy of the LIDAR data, or by picking up additional road indicators that may have been hidden or disrupted by adjacent traffic, pole reflectivity, vehicle speed, and other factors. Additional exemplary methods to gather lane data, lane nodes, and/or probable paths of vehicular travel can be found in U.S. patent application Ser. No. 14/069,069, filed on Oct. 31, 2013, and Ser. No. 14/273,620, filed on May 9, 2014, the disclosures of which are incorporated herein by reference in their entirety.

The present methods may combine coarse structured prior map data with precise LIDAR measurements in a number of inference algorithms to generate accurate road lane information. The methods may generate, from the coarse and precise LIDAR data, the number of lanes, the center of each lane, as well as the presence of any bicycle paths, entrance and exit ramps, road lane number changes, etc.

In certain aspects, a test vehicle can be used, including a plurality of sensors, such as the sensors described in reference to FIG. 1, in order to gather the relevant data. One or more of the sensors can be configured to capture changes in velocity, acceleration, wheel revolution speed, and distance to objects within the surrounding environment for use by the computing device 100 to estimate position and orientation of the test vehicle, steering angle for a dead-reckoning system, images for processing by an image sensor, test vehicle position in global coordinates based on signals from a plurality of satellites, or any other data and/or signals that could be used to determine the current state of the test vehicle or determine the position of the test vehicle in respect to its environment.

For example, if the sensors are configured to capture data for use by a black and white camera or by a LIDAR system, the sensors can capture data related to laser returns from physical objects in the area surrounding the test vehicle with ranging distances calculated by measuring the time it takes for a signal to return to the sensor. Laser or light returns can include the backscattered light reflected by objects hit by a source of light, e.g. laser light, being emitted by the sensors or another source on or proximate to the test vehicle. Once the light is reflected by an object, the sensors can capture intensity values and reflectivity of each point on the object to be used for analyzing and classifying the object, for example, by the processor 102, one of the applications 112 stored within or accessible to the computing device 100.

Figure 3:
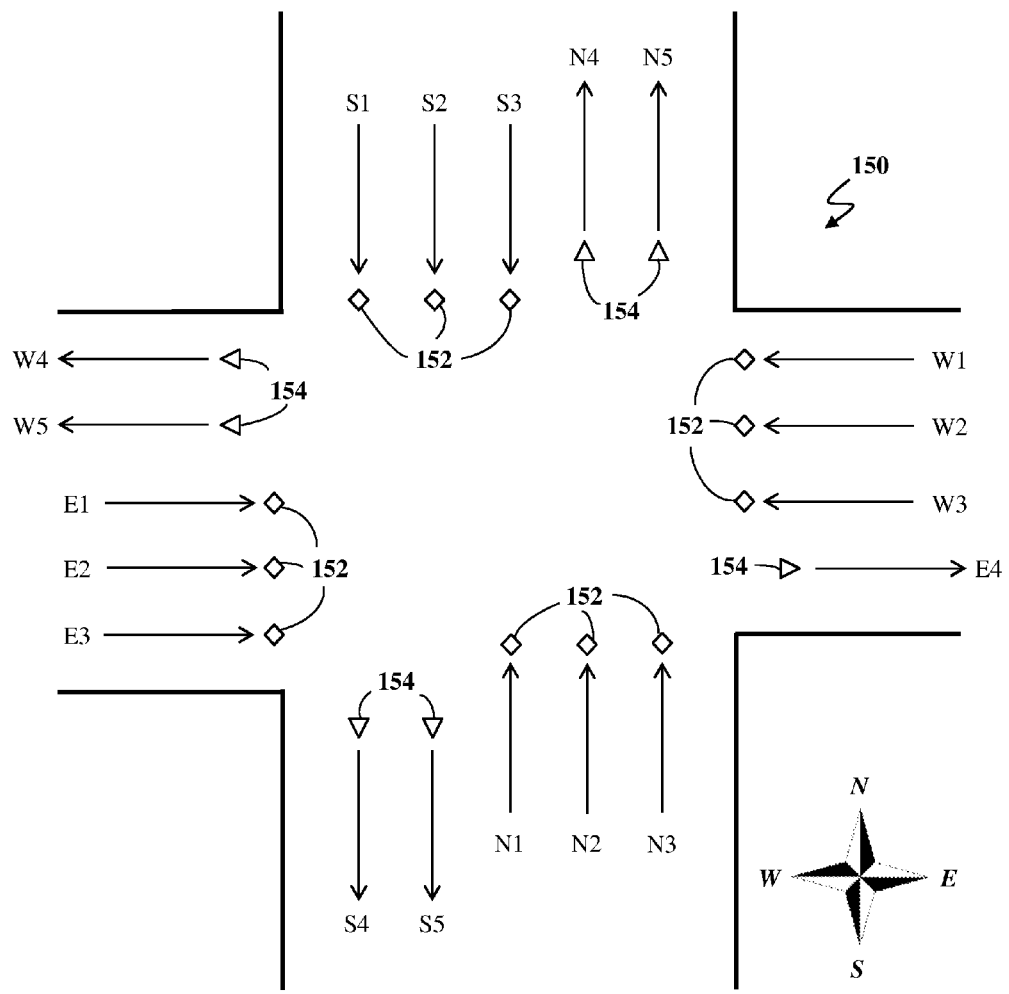
FIG. 3 is a depiction of an intersection from a multilane roadway illustrating various incoming and outgoing intersection lane nodes.

In one non-limiting example used to illustrate the methods of the present technology, a specific roadway intersection 150 is provided. As shown in FIG. 3, the intersection 150 includes: two incoming northbound lanes, one northbound center turn lane, and two outgoing northbound lanes; two incoming southbound lanes, one southbound center turn lane, and two outgoing southbound lanes; two incoming westbound lanes, one westbound center turn lane, and two outgoing westbound lanes; two incoming eastbound lanes, one eastbound center turn lane, and only one outgoing eastbound lane.

With continued reference to FIG. 3, as well as FIGS. 5-9, each of the lane nodes 152, 154 in the roadway intersection 150 is assigned a unique identifier. Incoming lane nodes 152 are shown having a diamond shape, while outgoing lane nodes are shown having a triangle shape 154. By way of example, the lane nodes labeled N1, N2, and N3 are incoming lanes nodes 152 for vehicles heading in a northern direction leading up to the intersection 150; N4 and N5 are outgoing lane nodes 154 for vehicles leaving the intersection 150 and heading north. The lane nodes labeled W1, W2, and W3 are incoming lanes nodes 152 for vehicles heading in a western direction leading up to the intersection 150; W4 and W5 are outgoing lane nodes 154 for vehicles leaving the intersection 150 and heading west. Similarly, the lane nodes labeled S1, S2, and S3 are incoming lanes nodes 152 for vehicles heading in a southern direction leading up to the intersection 150; S4 and S5 are outgoing lane nodes 154 for vehicles leaving the intersection 150 and heading south. Finally, the lane nodes labeled E1, E2, and E3 are incoming lanes nodes for vehicles heading in an eastern direction leading up to the intersection 150; E4 is the single outgoing lane node 154 for vehicles leaving the intersection 150 and heading east.

For example purposes of this particular intersection 150, it should be noted that vehicles travelling south and passing node S1 are in a right turn only lane, and must turn west, thereby passing either outgoing lane node W4 or W5. In other words, such vehicles are not legally allowed to travel south to lane nodes S4 or S5. It should also be understood that the respective center turn lanes are for making left turns only; they are not intended for making right turns or for passing straight through the intersection.

It is envisioned that, in various aspects, the methods of the present disclosure may use a first data set that includes road lane and/or lane node information that may be obtained as a first data set stored and/or may be received from a first source, and a second data set that includes vehicle trajectory information from an intersection structure of a roadway that may be obtained as a second data set and/or may be received from a second source. In embodiments where the lane nodes or road segment node locations are not provided, the methods of the present disclosure may include determining the lane node locations from at least one of the first and second data sets using known algorithms.

In one example, the first source may be a preexisting map database, such as data obtained from an Open Street Map (OSM) database or equivalent. This may provide a structurally informative, coarse map of streets, useful for identifying approximate intersection locations. In other aspects, the number of lanes and the number and location of each lane node can be received, or for example, obtained, from map data 116 (FIG. 1) or another suitable source. In various aspects, the map data 116 can be digital map information stored in the memory 104 of the computing device 100, stored in the external storage 114, or can be made available to the processor 102 from a remote location, such as by wireless transmission from a digital map data source. The map data 116 can include the existence and the location of stubs or splits in a roadway, as well as the distance of the stubs from predetermined locations along the roadway in advance of each stub, and the number of lanes in all sub-paths. In certain aspects, the number of lanes in the roadway may also be obtained from the camera 118. It should be understood, however, that this map information may only contain the approximate center lines of roads and streets, and not the number or positions of lanes. In addition, the reported street positions may be incorrect by multiple meters of lateral error. As such, the first source may additionally or alternatively comprise data obtained from a lane estimation algorithm using a combination of LIDAR data, road data, or other relevant data.

In one example, the second source providing the vehicle trajectory information may include at least one of LIDAR data, radar data, still image data, video data, tabular data, and combinations thereof. Where LIDAR data is used, vehicle detection and tracking algorithms may use the LIDAR data as input to generate a set of vehicle tracks that traverse intersections.

Figure 4:
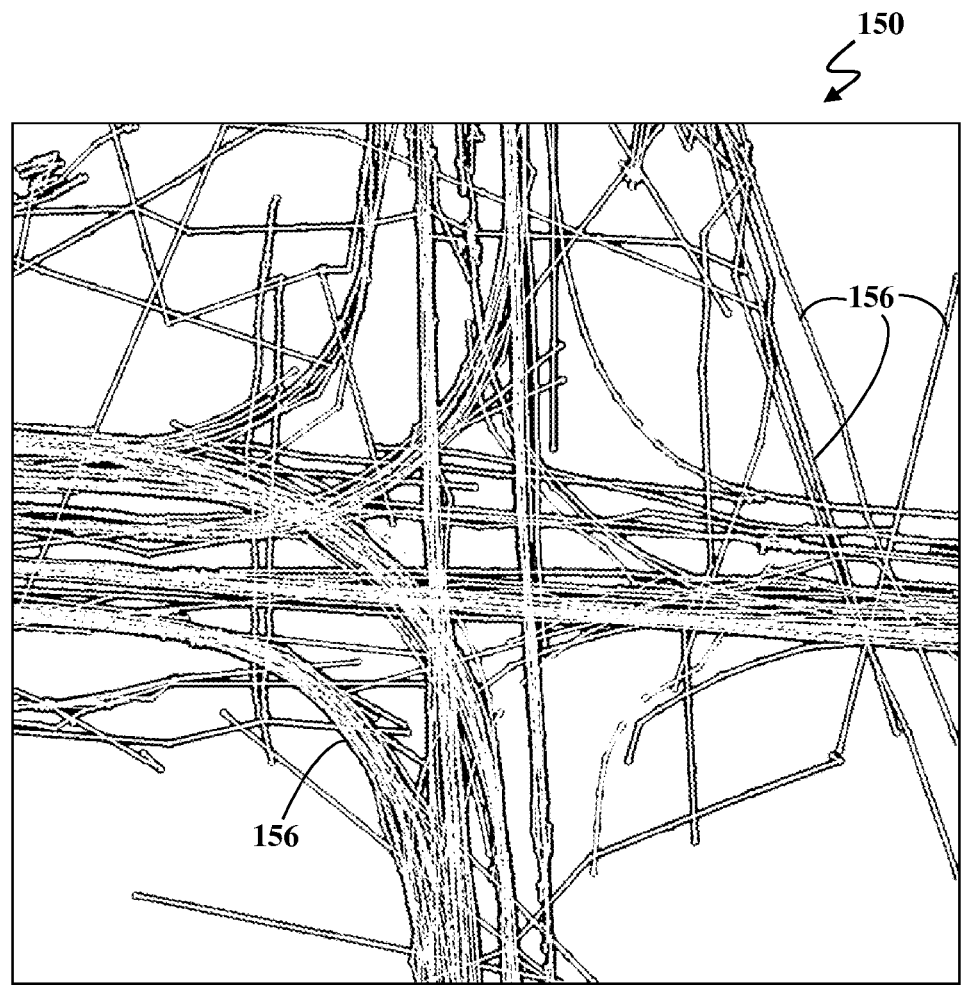
FIG. 4 is one example of a set of vehicle tracks associated with the intersection of FIG. 3.

In various aspects, it may be desirable to separate or filter a set of active tracks (for example, tracks located at least partially within or traversing an intersection) from all of the data obtained from a test vehicle gathering LIDAR data. For example, FIG. 4 illustrates an exemplary set of active vehicle tracks 156 obtained from processed LIDAR data of vehicles actually passing through at least a portion of the roadway intersection 150 of FIG. 3. In order to create a set of active tracks from the full scan of the data, certain of the following steps may be performed, such as: (1) discriminating between the ground and obstacles, resulting in a set of obstacle points; (2) clustering the obstacle points based on dynamically generated MRF energy minimization; (3) filtering the clusters based on size; (4) incorporating filtered clusters into active or new tracks using a data association scheme; and/or (5) updating a filter estimating the state (position and velocity) of each tracked vehicle.

As can be seen in FIG. 4, the active vehicle track data may include a high variability in the number of vehicle tracks per link and in positions along tracked paths. As used herein, a link is a representative track that begins at or near a first lane node and traverses the intersection, ending at or near a second lane node, which is different from the first lane node. Due to occlusions that may be caused by objects moving through a dynamic scene, motion of the test vehicle toward or away from the intersection, missed data associations, and other issues in the tracking pipeline, many of the tracks shown in FIG. 4 do not fully traverse the intersection. Thus, there are a large number of partial tracks in addition to complete tracks. In addition, due to variations in driving and/or errors in tracking position estimation, two tracks that traverse the same link(s) may often differ significantly in their location.

Figure 5:
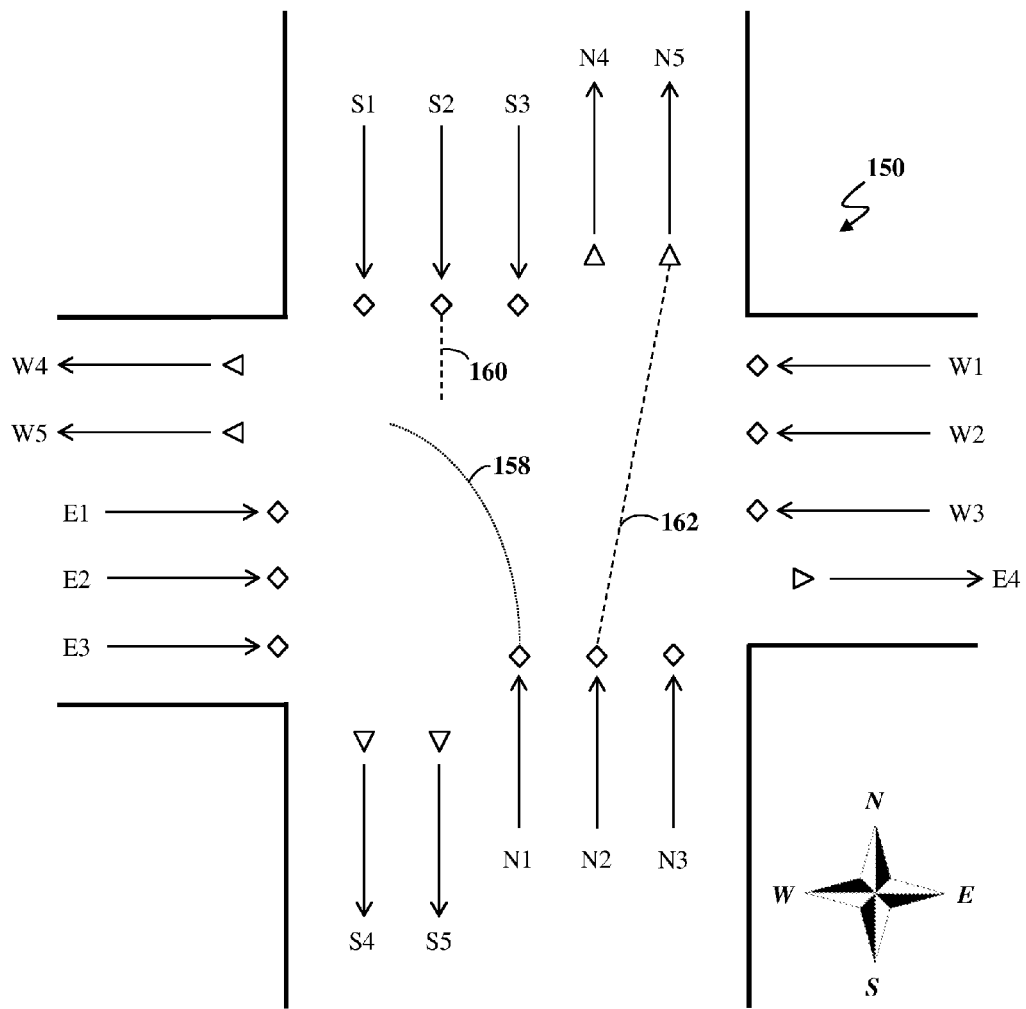
FIG. 5 is a depiction of partial and alternate vehicle tracks traveling on the roadway intersection of FIG. 3.

FIG. 5 illustrates examples of a partial turning track 158, a partial pass-through track 160, and a complete track 162 that may not be a legal track, such as a track from a vehicle that changes lanes in the middle of an intersection (for example, a vehicle moving from lane node N2 to N5 instead of moving from N2 to N4). According to the methods of the present disclosure, most or all data may be used so the track data T includes tracks that traverse the intersection, non-traversing tracks, and tracks with highly varying positions.

Figure 6:
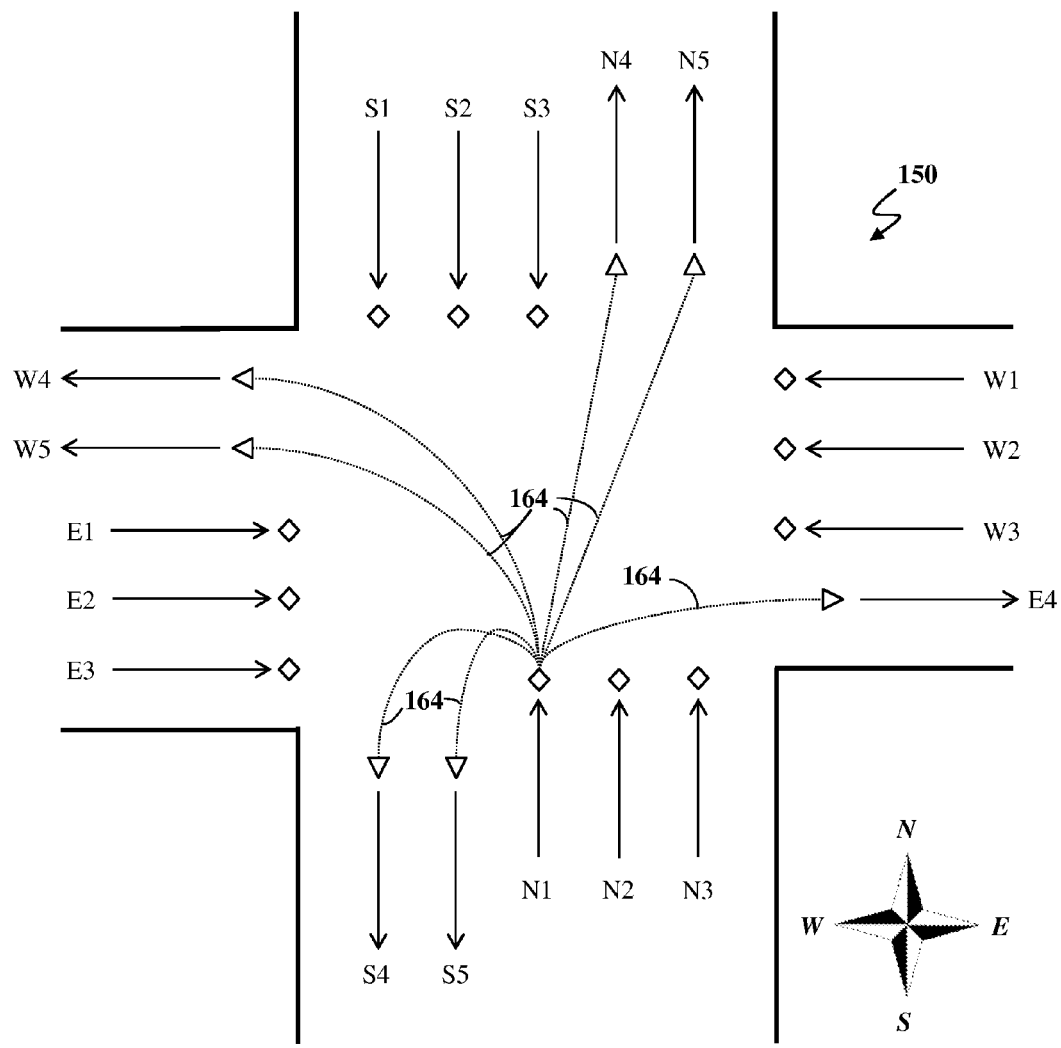
FIG. 6 is a depiction of each possible link from incoming lane node N1 to one of the available outgoing lane nodes of the roadway intersection of FIG. 3.

For a given intersection structure, the present technology provides the probabilistic modeling and inference for estimating the intersection structure that may be used with an autonomous vehicle. This makes the need for the creation of a model of the intersection structure that includes only the legal/valid paths, or valid links, out of a complete path/link set. By way of example, and with reference to FIG. 6, a vehicle that passes incoming lane node N1 technically has seven different path or link options for an outgoing lane node—S4, S5, W4, W5, N4, N5, and E4. Most U.S. drivers would acknowledge that the only valid links in FIG. 6 are from N1 to W4, or from N1 to W5 (assuming the links from N1 to S4 and from N1 to S5 are not legal/valid u-turns).

In various aspects, the present technology compiles a complete set of potential links between the lane node locations, and then assesses, for each link, a probability that the link is a valid link for use in the model intersection. Because the intersection 150 of FIG. 3 includes twelve different incoming lane nodes 152, each having seven different outgoing lane node 154 possibilities, there is a set of 84 potential links between the lane node locations. In various aspects, the methods of the present technology may assign each link with a probability value that the link is a valid link. As will be discussed below, the probability value may be based on the vehicle trajectory information/vehicle track data. The methods may include filtering the links based on a predetermined threshold probability value, and generating a set of valid links. A model of the intersection structure is then created based on the set of valid links. It should be understood that the set of valid links should include links that may not be technically "legal," but are commonly driven by drivers (for example, supported by the vehicle trajectory data). One such example may be path 162 of FIG. 5. Another example may be a right-hand turn into the second lane, for example, driving from W1 to N4, instead of from W1 to N5.

In various aspects, the vehicle track data from FIG. 4 may be processed so that the vehicle tracks can be categorized, separated, and/or filtered between complete tracks and partial tracks. For vehicle tracks classified as complete tracks, it is more than likely probable that the vehicle track correlates to a valid link that may connect two lane nodes (for example, the vehicle is tracked passing two node locations), and that particular complete track or valid link should be used in creating a model of the intersection structure. As such, the probability value for each complete track can be assigned a value of 1. For each partial track, the present technology contemplates assessing a probability that the partial track should be a valid link. The probability value for each partial track will be a fraction or numerical value between 0 and 1. In various aspects, partial tracks may, but are not required to, pass through at least one node location.

While it is possible to reason about the likelihood of each link individually, given the track set, this approach may fall short for at least two reasons. First, there may be unwanted links that may have a high degree of overlap with true links, and tracks generated from the true links will also support incorrect ones. Second, there may be some links that have very little or noisy data. Because of these issues, it may not be feasible to devise an approach that considers each link individually and also yields good results. As such, the present technology proposes a method that considers the joint probability of different link structures. The likelihoods of different structures (models) are then recombined in order to reason about or analyze each link. In order to compute the validity of a given link $\lambda_q$, the present technology uses a Bayesian Model Averaging approach that can be explained by the following equation:

$$p(\lambda_q|T) = \Sigma_{m \in M} p(\lambda_q|m) p(m|T)$$

in order to estimate the probability of the link given the track set T, where m is an intersection model. As commonly done when using Bayesian modeling, the set of models M is constrained to be parsimonious with the data. This may be done for computational reasons, as the number of models to be averaged is exponential in the number of possible links.

One important computation for evaluating the above equation is the probability $p(\lambda_q|T)$ that track t was generated while on link $\lambda$. The first step is to set this probability to zero (0) for all track-link pairs that are separated by more than a threshold distance $\gamma_\delta$. With reference to FIG. 6, the path indicated by reference number 160 may be too short to provide meaningful usage. For the remaining pairs, the probability calculation uses the positions along the track and the positions of the incoming and outgoing lane nodes 152, 154 to compute the following: (1) Whether the track passes within distance $\gamma_{node}$ of the incoming and outgoing nodes. If both are close, the track is traversing, or is a complete track; otherwise it is partially traversing, or is a partial track; (2) The average distance $\delta_\lambda^t$ between the track and a spline constructed from the incoming to outgoing nodes; and (3) For partially traversing tracks, the fraction $\rho_\lambda^t$ of the spline the track covers.

As noted above, for traversing tracks, the probability $p(t|\lambda) = 1$. For partially traversing tracks, $$P(t|\lambda) = \frac{f_r(\delta_\lambda^t, \rho_\lambda^t)}{\alpha_T} = \frac{1}{\alpha_T} sigm(\rho_\lambda^t; \gamma_{\rho,i}, \gamma_{\rho,s}) * (1 - sigm(\delta_\lambda^t; \gamma_{\delta,i}, \gamma_{\delta,s}))$$

which is essentially a product of the average distance and the observed distance of the track, where a soft-thresholding approach may be used via:

$$sigm(x; \gamma_i, \gamma_s) = \frac{1}{1 + e^{-\gamma_s(x - \gamma_i)}}$$

which is the logistic or sigmoid function, parameterized by $\gamma_i$ to determine the intersection value of x with y=0.5 crossing, and $\gamma_s$ to determine the slope.

The normalization constant may be given by evaluating $$\alpha_T = \int_0^1 \int_0^\infty f_T(\delta, \rho) d\delta d\rho$$

A model m of an intersection designates a set of links $\Lambda_m$ asserted to be valid. The probability of a model, given the track set, is:

$$p(m|T) = \frac{p(T|m)p(m)}{p(T)}$$

where $$p(T|m) = \prod_{t \in T} p(t|m)$$
$$= \prod_{t \in T} p(t|\lambda_{m,t})$$

where $\lambda_{m,t}$ is the link within $\Lambda_m$ that has the highest probability for track t. This is a simplifying assumption within the model. Additionally, $\lambda_{m,t}$ will equal the null link $\lambda_{none}$ when every valid link has distance $\delta_\lambda^t > \gamma_\delta$. $p(t|\lambda_{none}) = \gamma_{none}$ is defined to be a constant value.

In various aspects, the prior probability p(m) of model m is a hand-designed or custom function that is meant to model a suitable average number of links for a particular intersection, without penalizing. The prior probability may not have a large effect, as the data terms dominate. For example, if we let $n_{in}$ be the number of incoming nodes to the intersection, and we define the ideal number of links as:

$$n_{ideal} \begin{cases} 3n_{in} & : n_{in} <= 4 \\ 12 + 2n_{in} & : 4 < n_{in} <= 8 \\ 20 + n_{in} & : \text{else} \end{cases}$$

then $$p(m) = \frac{f_M(n_m)}{\alpha_M}$$

where $f_M(n_m)$ is implicitly parameterized by $n_{ideal}$ for each intersection, which may be different for each intersection. $f_M(n_m)$ is a function of the number of links $n_m$ in the model, centered around $n_{ideal}$, and is piecewise linear, defined by connecting the following points in order:

$$\{(n_{ideal} - \gamma_f, 0), (n_{ideal} - \gamma_n, 1), (n_{ideal} + \gamma_n, 1), (n_{ideal} + \gamma_f, 0)\}$$

and otherwise 0. The constants $\gamma_f$ and $\gamma_n$ define far and near offsets from the ideal, respectively.

The model normalization constant is the sum of this function over all models.

$$\alpha_M = \Sigma_m f_M(n_m)$$

For $n_t$ possible links in an intersection, the number of possible models is $2^{n_t}$ which may quickly grow too large to apply Bayesian Model Averaging as in $p(\lambda_q|T) = \Sigma_{m \in M} p(\lambda_q|m) p(m|T)$. By examining the tracks, and using the fact that traversing tracks provide a probability of 1, the set of models can be limited to only those that contain all links with traversing tracks, may contain links with partial tracks, and do not contain any links without corresponding tracks. If $n_p$ is the number of links with only partial tracks, then the size of the parsimonious models is $2^{n_p}$, which should be sufficiently small to enumerate and sum over.

Accordingly, taking into account the above explanations, the probability computation originally presented above now becomes:

$$p(\lambda_q|T) = \sum_{m \in M} p(\lambda_q|m) \frac{1}{p(T)} \frac{f_M(n_m)}{\alpha_M} \prod_{t \in T} \frac{f_T(\delta_{\lambda_{m,t}}^t, \rho_{\lambda_{m,t}}^t)}{\alpha_T}$$

After rearranging the terms and letting $p(\lambda_q|m) = I(\lambda_q \in \Lambda_m)$ be an indicator function on link $\lambda_q$ appearing in the link set for model m, one arrives at the final form:

$$p(\lambda_q|T) = \frac{1}{p(T)} \sum_{m \in M} I(\lambda_q \in \Lambda_m) \frac{f_M(n_m)}{\alpha_M} \prod_{t \in T} \frac{f_T(\delta_{\lambda_{m,t}}^t, \rho_{\lambda_{m,t}}^t)}{\alpha_T}$$

Although the main computational issue of the number of models to sum over has been addressed above, there are a number of ways to speed up the above equation. For example, the normalization $\alpha_M$ is constant for each intersection and can be cached. The normalization $\alpha_T$ is constant given the logistic parameters $\gamma_{p,i}$, $\gamma_{p,s}$, $\gamma_{\delta,i}$, $\gamma_{\delta,s}$, and can be cached. The function $f_T(\delta_{\lambda_{m,t}}^t, \rho_{\lambda_{m,t}}^t)$ is pre-computed for all link-track pairs within the threshold distance. Within the product in the above equation, the proper value is selected based on the link $\lambda_{m,t}$ for model m.

Finally, computation of the normalization factor p(T) is greatly simplified by the assumption that the probability of link $\lambda_{tr}$ with at least one traversing track is 1, so $p(\lambda_{tr}|T)=1$. Due to the selection of parsimonious models, $I(\lambda_{tr} \in \Lambda_m)=1$ for all models. Thus, we have $$p(T) = \sum_{m \in M} \frac{f_{M(n_m)}}{\alpha_M} \prod_{t \in T} \frac{f_T(\delta_{\lambda_{m,t}}^t, \rho_{\lambda_{m,t}}^t)}{\alpha_T}$$

which is believed to be a fairly straightforward value to compute, provided the above discussion.

Once a probability value is determined or assigned for the links associated with partial tracks, the methods of the present technology include filtering the links based on a predetermined threshold probability value. For example, in one example it may be determined that any link having a probability value of less than about 0.6 is not a valid link and should be discarded. As such, the predetermined threshold probability value is assigned the value of 0.6, and all links having a probability value of less than 0.6 are excluded from the set of valid links.

Figure 7:
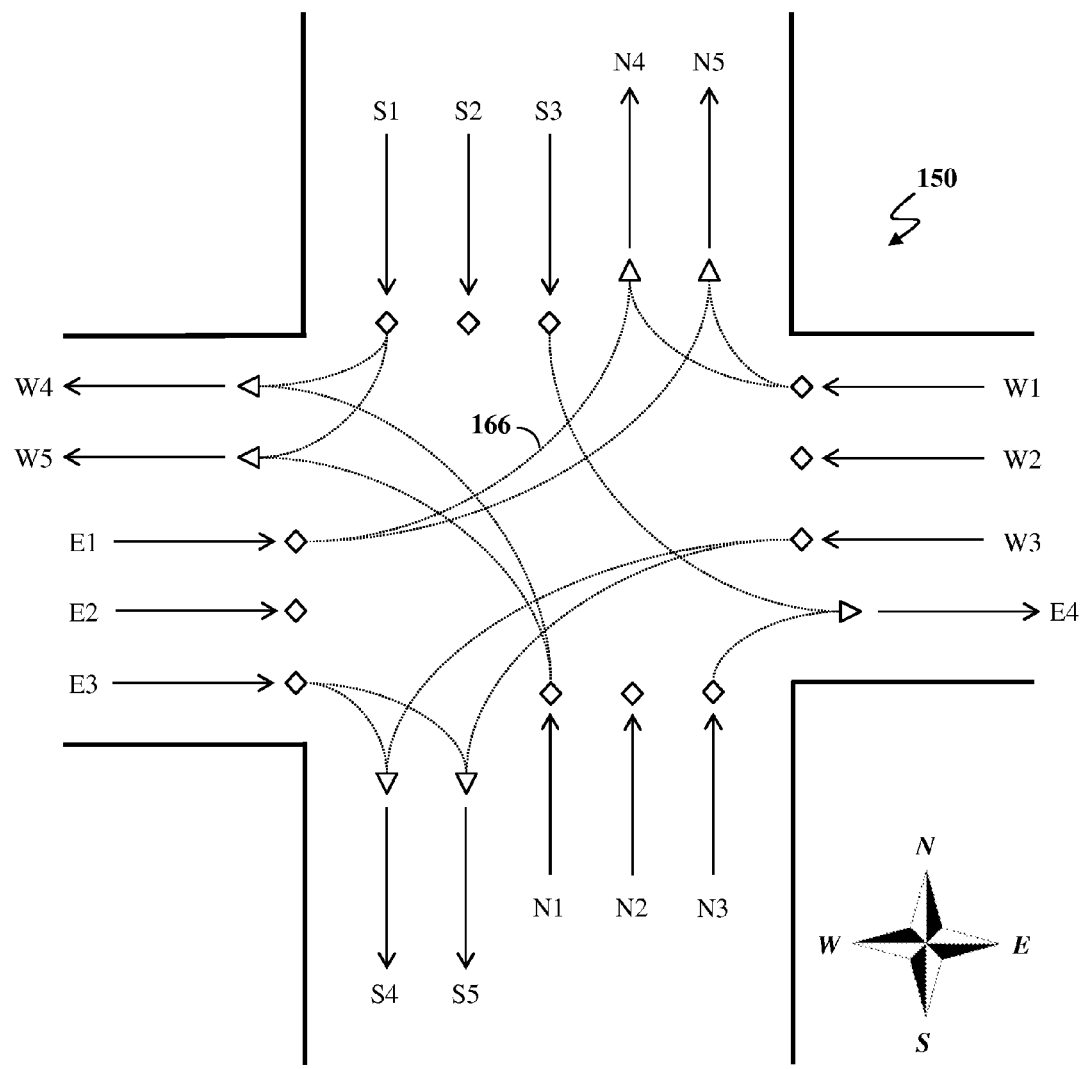
FIG. 7 is a depiction of each possible valid turn link for vehicles using the roadway intersection of FIG. 3.
Figure 8:
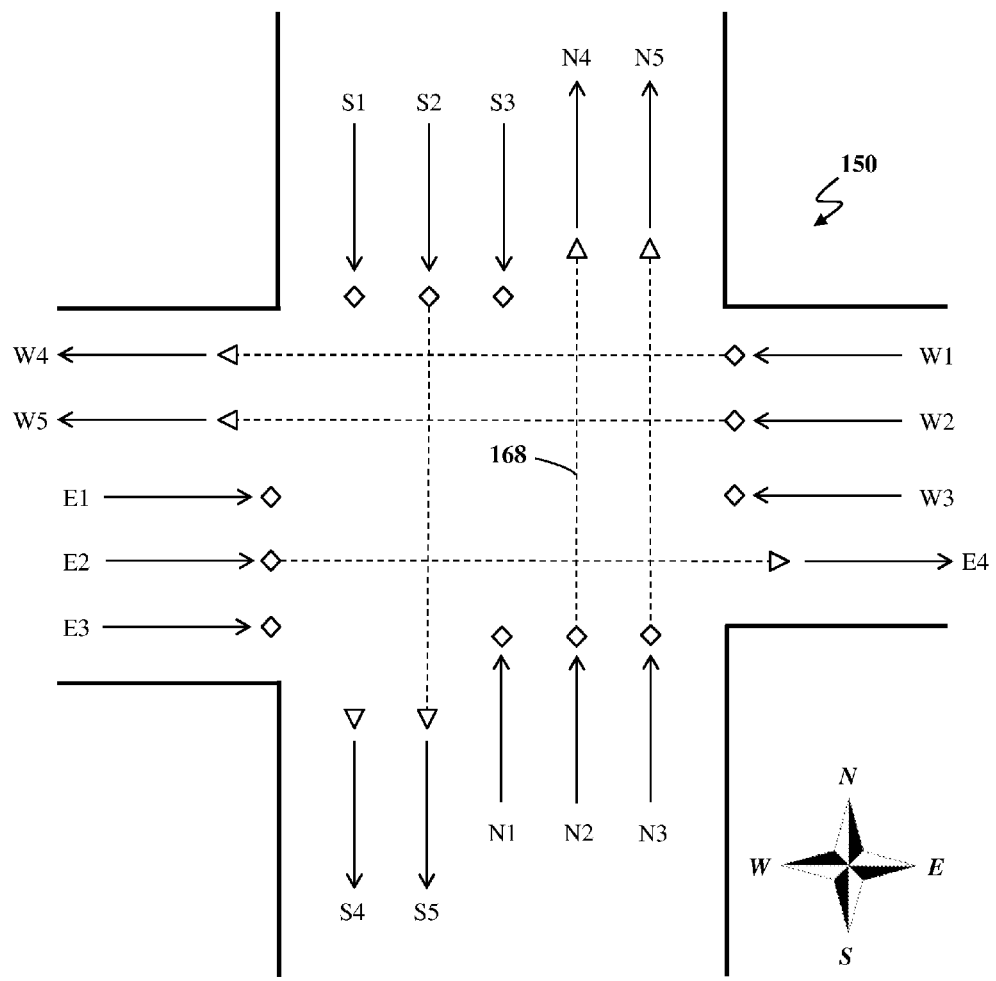
FIG. 8 is a depiction of each possible valid pass-through link for vehicles using the roadway intersection of FIG. 3.
Figure 9:
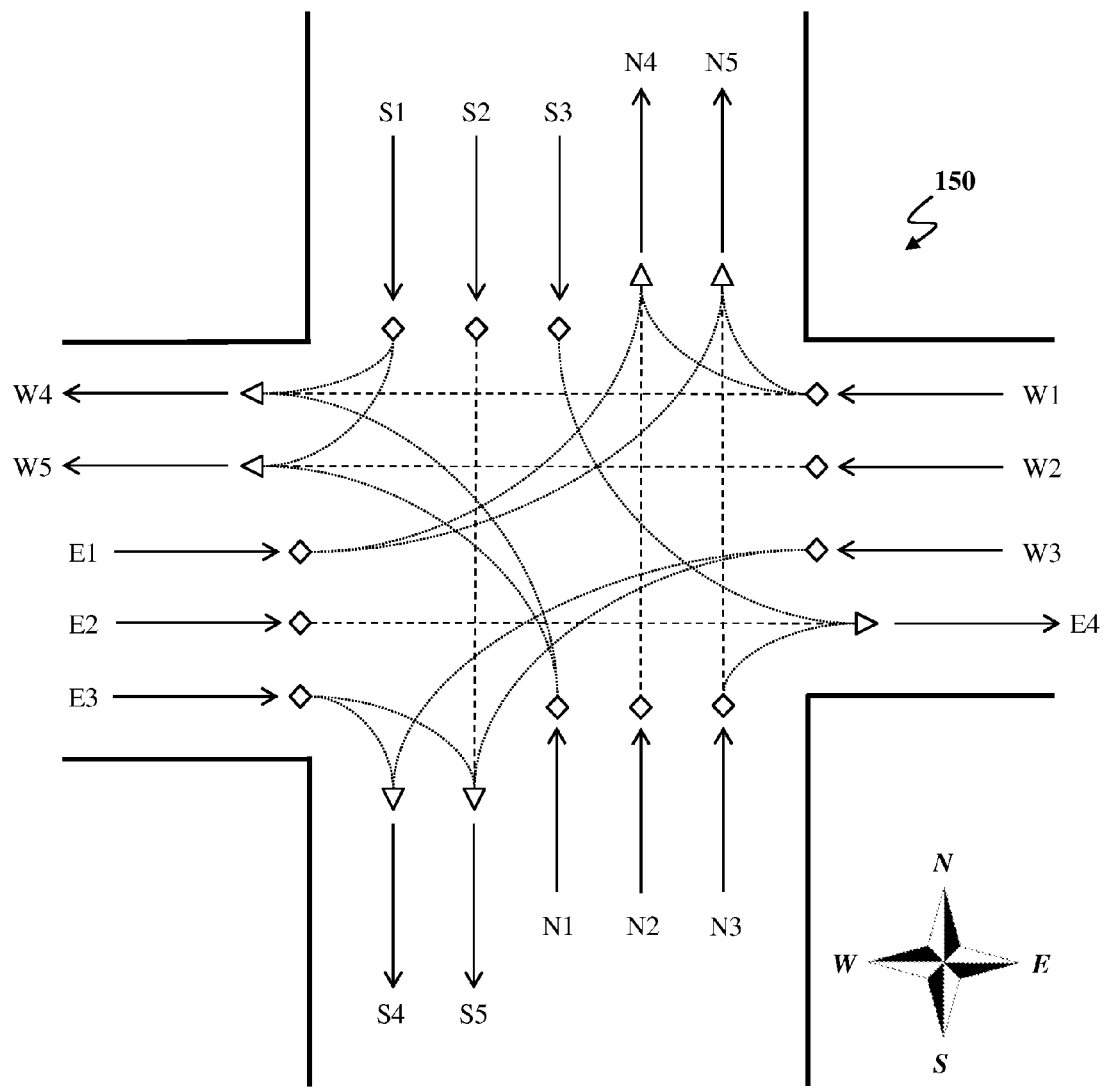
FIG. 9 is a combined view of the valid links of FIGS. 7 and 8.

For the intersection of FIG. 3, using the vehicle trajectory information as found in FIG. 4, FIG. 7 is a depiction of each possible valid turn link, designated by dotted lines 166, and FIG. 8 is a depiction of each possible valid pass-through link, designated by dashed lines 168. FIG. 9 is a model of the intersection of FIG. 3, which is a combination of the set of valid links of FIGS. 7 and 8. Thus, of the 84 possible links connecting the incoming nodes 152 with outgoing nodes 154, there are fourteen valid turn links, and six valid pass-through links.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

What is claimed is:

1. A method of modeling an intersection structure of a roadway to provide a detailed intersection map for a fully automated driving system, the method comprising:
   receiving, at a computing device, a first data set including road lane information;
   receiving, at the computing device, a second data set including vehicle trajectory information for an intersection structure of a roadway;
   determining, using the computing device, lane node locations from at least one of the first and second data sets;
   compiling, using the computing device, a set of potential links between the lane node locations;
   assessing, for each link, a probability that the link is a valid link by using a tracking algorithm to obtain a plurality of complete tracks from the second data set, wherein each complete track represents a single vehicle tracked through the intersection;
   correlating each complete track with a link;
   assigning each link with a probability value, with each link that is correlated with a complete track being assigned a probability value of 1;
   filtering the links, using the computing device, based on a predetermined threshold probability value and generating a set of valid links;
   creating, using the computing device, a model of the intersection structure based on the set of valid links;
   providing a detailed intersection map with valid connections between lanes, based on the model of the intersection, for a fully automated driving system; and
   utilizing the detailed intersection map by the fully automated driving system.

2. The method according to claim 1, wherein each complete track represents a single vehicle tracked passing two node locations.

3. The method according to claim 1, further comprising:
   using the tracking algorithm to obtain a plurality of partial tracks from the second data set, each partial track representing a single vehicle tracked through at least a portion of the intersection; and
   correlating each partial track with a link.

4. The method according to claim 3, wherein the partial track passes through at least one node location.

5. The method according to claim 3, wherein the step of assigning the probability value to a link that is correlated with a partial track comprises using a Bayesian Model Averaging technique to calculate a probability value that is less than 1.

6. The method according to claim 5, wherein the Bayesian Model Averaging technique is governed by an equation:

$$p(\lambda_q|T) = \Sigma_{m \in M} p(\lambda_q|m) p(m|T)$$

wherein $p(\lambda_q|T)$ is the probability value of the link ($\lambda_q$), given a set of partial tracks (T), where m is an intersection model and a set of intersection models (M) is parsimonious with data used with the equation.

7. The method according to claim 1, wherein the road lane information is received from a first source, and the vehicle trajectory information is received from a second source.

8. The method according to claim 7, wherein the first source comprises a preexisting map database.

9. The method according to claim 7, wherein the first source comprises data obtained from a lane estimation algorithm using a combination of light detection and ranging (LIDAR) data and road map data.

10. The method according to claim 7, wherein the second source comprises at least one of LIDAR data, radar data, still image data, video data, tabular data, and combinations thereof.

11. The method according to claim 1, wherein the predetermined threshold probability value is assigned a value specific to the intersection, and filtering the links comprises excluding all links having a probability value of less than the predetermined threshold probability value from the set of valid links.

12. A method of modeling an intersection structure of a roadway to provide a detailed intersection map for a fully automated driving system, the method comprising:
   identifying, using a computing device, a set of links between lane node locations for an intersection structure of a roadway;

using vehicle trajectory information from the intersection structure to generate, using the computing device, a set of vehicle tracks that passed through the intersection;

categorizing the vehicle tracks into complete tracks and partial tracks;

assessing, using the computing device, for each partial track, a probability that the partial track correlates to a link, wherein the probability is determined using a Bayesian Model Averaging technique;

generating a set of valid links by:
- assigning each complete vehicle track a probability value of 1;
- assigning each partial vehicle track a probability value that is less than 1; and
- filtering the links based on a predetermined threshold probability value;

creating, using the computing device, a model of the intersection structure based on the set of valid links;

providing a detailed intersection map with valid connections between lanes, based on the model of the intersection, for a fully automated driving system; and utilizing the detailed intersection map by the fully automated driving system.

13. The method according to claim 12, wherein the set of valid links excludes all links having an assigned probability value of less than the predetermined threshold probability value.

14. The method according to claim 12, wherein the Bayesian Model Averaging technique is governed by an equation:

$$p(\lambda_q|T) = \Sigma_{m \in M} p(\lambda_q|m) p(m|T)$$

wherein $p(\lambda_q|T)$ is the probability value of the link ($\lambda_q$), given a set of partial tracks (T), where m is an intersection model and a set of intersection models (M) is parsimonious with data used with the equation.

* * * * *